(12) United States Patent
James et al.

(10) Patent No.: US 10,191,499 B2
(45) Date of Patent: Jan. 29, 2019

(54) GAS DISTRIBUTION SYSTEM WITHIN TEMPERATURE DIFFERENTIATED ENVIRONMENTS

(71) Applicant: Microsoft Corporation, Redmond, WA (US)

(72) Inventors: Sean James, Olympia, WA (US); Christian L. Belady, Mercer Island, WA (US); Stephan W. Gilges, Seattle, WA (US); Sriram Sankar, Kirkland, WA (US); John Siegler, Carnation, WA (US); Brian Andersen, Kent, WA (US); Eric C Peterson, Woodinville, WA (US); J Darrin Schroeder, San Antonio, TX (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 843 days.

(21) Appl. No.: 14/322,909

(22) Filed: Jul. 2, 2014

(65) Prior Publication Data

US 2016/0004263 A1    Jan. 7, 2016

(51) Int. Cl.
*H05K 7/20* (2006.01)
*G05D 23/00* (2006.01)
(Continued)

(52) U.S. Cl.
CPC .............. *G05D 23/00* (2013.01); *E04B 5/48* (2013.01); *E04B 9/00* (2013.01); *F24F 11/0001* (2013.01);
(Continued)

(58) Field of Classification Search
CPC .. H05K 7/20; H05K 7/20009; H05K 7/20145; H05K 7/20536; H05K 7/20554; H05K 7/20709
(Continued)

(56) References Cited

U.S. PATENT DOCUMENTS 5,801,827 A * 9/1998 Moriya ................. G01N 21/72
356/315
7,800,900 B1 * 9/2010 Noteboom ......... H05K 7/20745
165/104.22
(Continued)

FOREIGN PATENT DOCUMENTS

CN      102762926 A    10/2012
CN      102762927 A    10/2012
(Continued)

OTHER PUBLICATIONS

"International Preliminary Report on Patentability Issued in PCT Application No. PCT/US2015/038717", dated Jun. 17, 2016, 7 Pages.
(Continued)

*Primary Examiner* — Ned Landrum
*Assistant Examiner* — Daniel C Comings
(74) *Attorney, Agent, or Firm* — The Watson I.P. Group, PLC; Vladan M. Vasiljevic (57) ABSTRACT

Electrical power is provided to power consuming, heat-exhausting devices by multiple gas-fueled electrical power sources located near such devices. Exhaust heat from such devices is utilized as intake cooling air for the gas-fueled power sources, thereby excluding them from cooling capacity requirements. The gas piping delivering gas to gas-fueled power sources is positioned so as to be within hot aisles comprising exhaust heat. The gas piping is located up high for lighter than air gasses and near the floor for heavier than air gasses, with leak detection located nearby. Additionally, gas piping is externally coated with material that visually indicates a leak. By locating gas piping in the hot aisle, exhausted heat increases temperature and, thereby, pressure of the gas, resulting in more efficient gas distribution through the piping and preventing valve freezing. Further-
(Continued)

more, the gas piping is located after potential ignition sources in the airstream.

20 Claims, 4 Drawing Sheets

(51) Int. Cl.
    *E04B 5/48*           (2006.01)
    *E04B 9/00*           (2006.01)
    *F24F 11/00*          (2018.01)
    *F24F 11/30*          (2018.01)

(52) U.S. Cl.
    CPC .......... *F24F 11/30* (2018.01); *H05K 7/20136* (2013.01); *H05K 7/20145* (2013.01); *H05K 7/20554* (2013.01); *H05K 7/20536* (2013.01)

(58) Field of Classification Search
    USPC .......... 62/79, 236, 238.1, 259.1, 259.2, 408, 62/414, 419
    See application file for complete search history.

(56) References Cited

U.S. PATENT DOCUMENTS

| | | |
|---|---|---|
| 8,209,993 B2 | 7/2012 | Carlson et al. |
| 8,422,218 B2 | 4/2013 | Fried et al. |
| 2003/0124401 A1* | 7/2003 | Issacci .............. H01M 8/04014 |
| | | 429/439 |
| 2007/0068224 A1* | 3/2007 | Watanabe ............. G01M 3/226 |
| | | 73/40.7 |
| 2009/0168345 A1 | 7/2009 | Martini |
| 2010/0136895 A1 | 6/2010 | Sgro |
| 2011/0100618 A1 | 5/2011 | Carlson |
| 2012/0087087 A1 | 4/2012 | Nicolai et al. |
| 2012/0168145 A1 | 7/2012 | Peterson et al. |
| 2013/0163192 A1 | 6/2013 | Ballantine et al. |
| 2013/0163193 A1* | 6/2013 | Ballantine .......... H05K 7/20763 |
| | | 361/679.47 |
| 2014/0096837 A1 | 4/2014 | Belady et al. |
| 2014/0173299 A1 | 6/2014 | McKnight et al. |

FOREIGN PATENT DOCUMENTS

| | | |
|---|---|---|
| JP | 08031436 A * 2/1996 | ............. H01M 8/04 |
| JP | H09297104 A | 11/1997 |
| JP | 2007078591 A | 3/2007 |
| WO | 2012137692 A1 | 10/2012 |
| WO | 2014041819 A1 | 3/2014 |

OTHER PUBLICATIONS

Riekstin, et al., "No More Electrical Infrastructure: Towards Fuel Cell Powered Data Centers", In Proceedings of the Workshop on Power-Aware Computing and Systems, Nov. 3, 2013, 5 pages.

Kennedy, Daniel, "Ramification of Server Airflow Leakage in Data Centers with Aisle Containment", Published on: Jan. 6, 2012, Available at: http://tateinc.com/pdf/ramification_leakage_aisle_containment.pdf.

"International Search Report & Written Opinion Received for PCT Application No. PCT/US2015/038717", dated Oct. 8, 2015, 12 Pages.

"First Office Action and Search Report Issued in Chinese Patent Application No. 201580036164.2", dated Dctober 23, 2018, 9 pages.

* cited by examiner

GAS DISTRIBUTION SYSTEM WITHIN TEMPERATURE DIFFERENTIATED ENVIRONMENTS

BACKGROUND

The throughput of communications, between multiple computing devices that are transmitted via network connections, continues to increase. Modern networking hardware enables physically separate computing devices to communicate with one another orders of magnitude faster than was possible with prior generations of networking hardware. Furthermore, high-speed network communication capabilities are being made available to a greater number of people, both in the locations where people work, and in their homes. As a result, an increasing amount of data and services can be meaningfully provided via such network communications. Additionally, it has become more practical to perform digital data processing at a location remote from the user requesting such processing, or on whose behalf such processing is being performed. Consequently, large quantities of data processing capability are being aggregated into centralized locations that comprise dedicated hardware and support systems. The large quantities of data processing offered by such centralized locations can then be shared across networks.

To provide such large-scale data and processing capabilities, via network communications, from a centralized location, the centralized location typically comprises hundreds or thousands of computing devices, typically mounted in vertically oriented racks. Such a collection of computing devices, as well as the associated hardware necessary to support such computing devices, and the physical structure that houses the computing devices and associated hardware, is traditionally referred to as a "data center". With the increasing availability of high-speed network communication capabilities, and thus the increasing provision of data and services from centralized locations, as well as the traditional utilization of data centers, such as the provision of advanced computing services and massive amounts of computing processing capability, the size and quantity of data centers continues to increase.

However, computing devices consume energy and generate heat when performing processing. The aggregation of large quantities of computing devices in a single data center results in large amounts of power consumption and large quantities of heat being generated that must be removed in order to enable the computing devices to continue to operate optimally and avoid overheating. Traditionally, data center power is provided by electricity sourced from a conventional electrical power grid and delivered to the various computing devices and support hardware through common metal-wire electrical connections. Similarly, traditionally, data center cooling is provided by forced-air mechanisms that deliver cool air into a data center and remove hot air therefrom. The cool air is typically provided by cooling recirculated air through the use of power-consuming cooling methodologies, such as air-conditioning. The power consumed by the computing devices, support hardware and air conditioning can introduce substantial cost into the operation of a data center. For example, large air conditioning units, such as are typically required by a data center, can consume large quantities of electrical power, often during the most expensive times of the day, resulting in high energy costs.

SUMMARY

Electrical power for devices that generate heat as a byproduct, such as computing devices and other hardware in a data center, can be provided by gas-fueled electrical power sources, such as fuel cells and gas-powered electrical generators. For efficiency and heat management, a myriad of such gas-fueled power sources can be utilized, with each individual gas-fueled power source being located physically proximate to the devices consuming such power. One such efficiency and heat management advantage to locating individual gas-fueled power sources proximate to the devices consuming such power can be that the exhaust heat from such devices can be utilized as intake cooling air for the gas-fueled power sources, thereby excluding the gas-fueled power sources from the cooling capacity requirements of the facility. The gas piping delivering gas to such gas-fueled power sources can be installed and arranged so as to be within defined physical spaces where excess heat is exhausted, typically known as "hot aisles". For gases that are lighter than air, the gas piping can be located near the top of the hot aisles, while the gas piping for gases that are heavier than air can be located near the floor. Leak detection can be positioned above such piping for gases that are lighter than air and below such piping for gases that are heavier than air. Additionally, the piping can be externally coated with material that can visually indicate a leak, such as material that reacts with the gas being carried in the pipe in a visual manner. By locating the gas piping in the hot aisle, the exhausted heat can increase the temperature of the gas, thereby reducing the energy requirements for fuel preheating, preventing valve freezing and aiding gasification of liquid fuel. Furthermore, the gas piping, or at least potential leak points of the gas piping, can be located after potential ignition sources in the airstream, thereby reducing gas ignition risks.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Additional features and advantages will be made apparent from the following detailed description that proceeds with reference to the accompanying drawings.

DESCRIPTION OF THE DRAWINGS

The following detailed description may be best understood when taken in conjunction with the accompanying drawings, of which.

DETAILED DESCRIPTION

The following description relates to the routing and location of gas piping in a temperature-controlled environment where such gas piping provides gas to, either directly or indirectly, power devices that generate waste heat. For efficiency and heat management, multiple gas-fueled power sources can be utilized to provide power to devices, with each individual gas-fueled power source being located physically proximate to the devices consuming such power.

One such efficiency and heat management advantage to locating individual gas-fueled power sources proximate to the devices consuming such power can be that the exhaust heat from such devices can be utilized as intake cooling air for the gas-fueled power sources, thereby excluding the gas-fueled power sources from the cooling capacity requirements of the temperature-controlled environment. The gas piping delivering gas to such gas-fueled power sources can be installed and arranged so as to be within defined physical spaces where excess heat is exhausted, typically known as "hot aisles". For gases that are lighter than air, the gas piping can be located near the top of the hot aisles, while the gas piping for gases that are heavier than air can be located near the floor. Leak detection can be positioned above such piping for gases that are lighter than air and below such piping for gases that are heavier than air. Additionally, the piping can be externally coated with material that can visually indicate a leak, such as material that reacts with the gas being carried in the pipe in a visual manner. By locating the gas piping in the hot aisle, the exhausted heat can increase the temperature of the gas, can prevent valve freeze, can aid in the gasification of liquid fuel and can provide other advantages. Some gas-fuel powered sources, such as fuel cells, require that the fuel be preheated before use. The increase in temperature reduces the energy required to heat the fuel. Furthermore, the gas piping can be located after potential ignition sources in the airstream, thereby reducing gas ignition risks.

The techniques described herein make reference to specific environments, such as data center environments where the devices consuming power and generating waste heat are computing devices, such as the ubiquitous rack-mounted server computing devices. Such references, however, are strictly exemplary and are made for ease of description and presentation, and are not intended to limit the mechanisms described to the specific environments and computing devices enumerated. Indeed, the techniques described herein are equally applicable, without modification, to any environment in which heat is generated as a byproduct of power-consuming devices, and in which the power consumed by such devices is provided, either directly or indirectly, by gases that are piped through such an environment.

Figure 1:
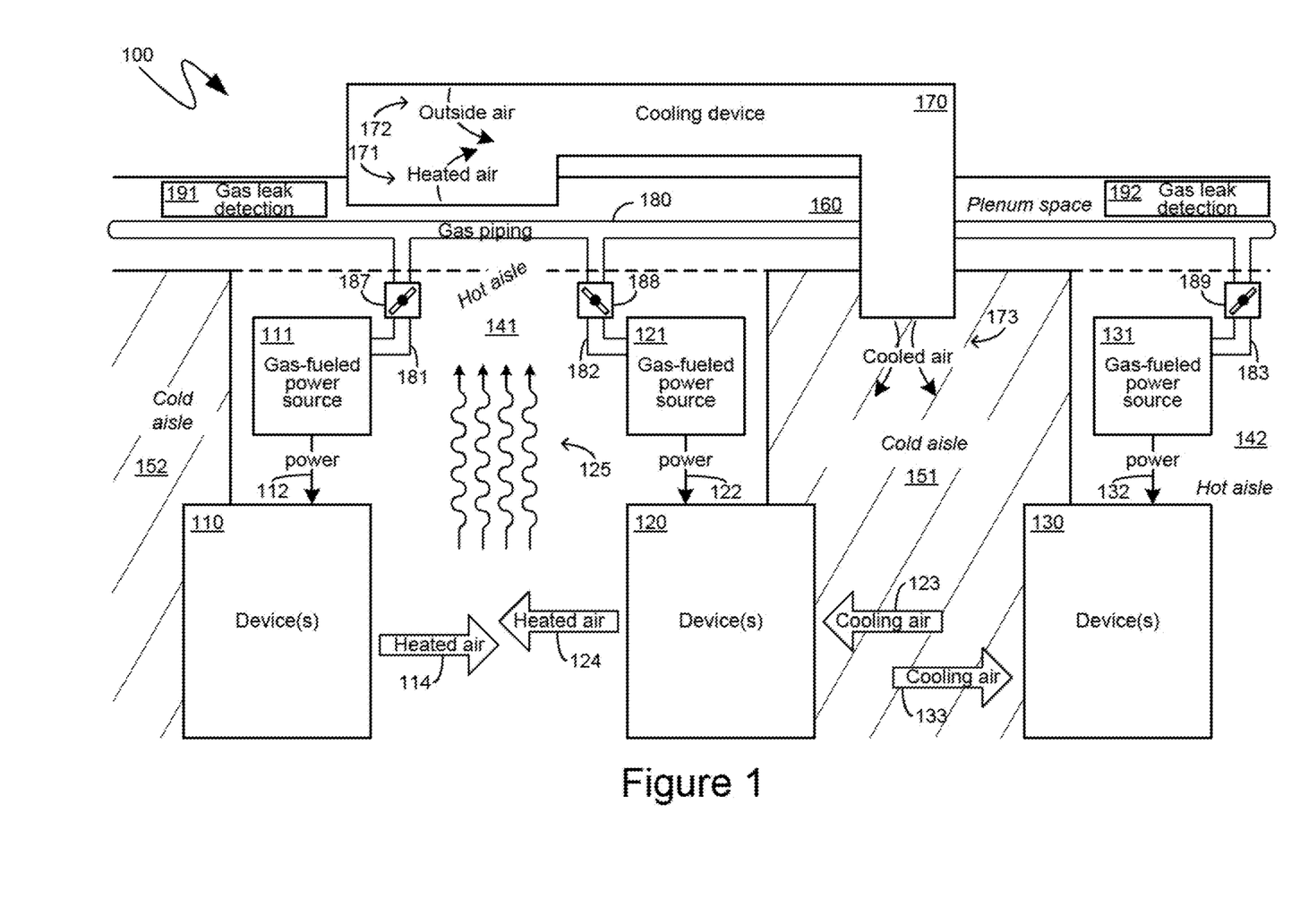
FIG. 1 is a block diagram of an exemplary gas distribution system within a temperature-differentiated environment.

With reference to FIG. 1, an exemplary system 100 is shown therein, illustrating one aspect of the location of the gas piping in a climate controlled environment comprising devices generating waste heat. In particular, the exemplary system 100 of FIG. 1 illustrates three devices, namely the devices 110, 120 and 130, which can consume power, such as the power 112, 122 and 132, respectively, and can generate waste heat, such as in the form of the heated air 114 and 124. The devices 110, 120 and 130 can, according to one aspect, comprise one or more computing devices, such as blade server computing devices arranged in one or more racks, such as would be typically found within a data center. The devices 110, 120 and 130 are not, however, limited to computing devices and can, according to other aspects, be any device that generates waste heat in performing a useful function including, for example, manufacturing devices, production devices, construction devices, and other like devices.

Heat generating devices, such as the exemplary devices 110, 120 and 130, which are illustrated in the system 100 of FIG. 1, can consume power, such as the power 112, 122 and 132, respectively, in performing useful functions, and, thereby, generating waste heat. Such power can be sourced, either directly or indirectly, from gas including, for example, natural gas, shale gas, biogas, propane, and other like gaseous substances that can provide power energy. According to one aspect, the heat generating devices, such as the exemplary devices 110, 120 and 130, can directly consume the gas to perform useful functions. For example, the exemplary devices 110, 120 and 130 can comprise natural gas powered motors that can convert natural gas to mechanical energy for the performance of useful functions. According to another aspect, however, gas can be utilized to generate another, potentially more ubiquitous, form of power, such as, for example, electrical power. According to such an aspect, gas can be provided to a gas-fueled power source, such as the exemplary gas-fueled power sources 111, 121 and 131. The gas-fueled power sources can then provide power, such as electrical power, to devices to enable those devices to perform useful functions. Thus, in the exemplary system 100 shown in FIG. 1, the exemplary devices 110, 120 and 130 are illustrated as receiving the power, 112, 122 and 132, respectively, from gas-fueled power sources 111, 121 and 131, respectively.

Devices that generate heat in the performance of useful functions, such as the exemplary devices 110, 120 and 130, shown in FIG. 1, are often physically arranged, such as within a building, or other structure housing such devices, to exhaust such waste heat into defined areas of the building that are typically referred to as "hot aisles". As utilized herein, the term "hot aisle" means any defined physical space, whether bounded or unbounded, into which waste heat is specifically directed and exhausted for climate control purposes. A "hot aisle", as that term is defined herein, can be a physical space bounded by floors, walls, ceilings, or combinations thereof. A "hot aisle", as that term is defined herein, can also be specific ductwork, piping, or other like air conveyance, and does not need to be an "aisle" in the sense of a passage for human travel. For example, the exemplary devices 110 and 120 are illustrated in FIG. 1 as exhausting heated air, in the form of the heated air 114 and 124, respectively, into a hot aisle 141. Although not specifically illustrated, the exemplary device 130 can be oriented to exhaust heated air into the hot aisle 142.

In addition to hot aisles, buildings housing devices, such as exemplary devices 110, 120 and 130, can be climate controlled to provide cooling air to the devices by which the devices can be cooled and can exhaust their waste heat in the form of heated air, such as the exemplary heated air 114 and 124 that is illustrated in FIG. 1. Such climate control can provide for "cold aisles", with the devices situated between such cold aisles and the hot aisles described above. For example, as illustrated in the exemplary system 100 of FIG. 1, the exemplary device 120 can be positioned between the hot aisle 141 and a corresponding cold aisle 151, such that the exemplary device 120 can draw in cooling air 123 from the cold aisle 151 across the exemplary device 120, thereby cooling the exemplary device 120 and generating the heated air 124 that is exhausted into the hot aisle 141. The exemplary device 130 can, similarly, draw in cooling air 133, from the cold aisle 151, and utilize such cooling air to cool the exemplary device 130, resulting in the exhausting of waste heat into the hot aisle 142, which is not specifically illustrated in FIG. 1. The exemplary device 110 can draw in cooling air from the cold aisle 152 and utilized such cooling air, not specifically illustrated in FIG. 1, to cool the exemplary device 110 and exhaust waste heat, in the form of the heated air 114, into the hot aisle 141. Therefore, as can be seen from FIG. 1, the exemplary device 110 can be positioned between the cold aisle 152 and the hot aisle 141, the exemplary device 120 can be positioned between the cold aisle 151 and the hot aisle 141, and the exemplary device 130 can be positioned between the cold aisle 151, and the hot aisle 142. Colloquially, the devices are positioned such that their "cool sides" face one another and, similarly, their "hot sides" face one another, thereby establishing the aforementioned hot aisles and cold aisles.

As indicated, the structure within which devices, such as exemplary devices 110, 120 and 130, are situated can be a climate-controlled building. Consequently, the exemplary system 100 of FIG. 1 illustrates a cooling device 170 that can be positioned to provide cooled air 173 into one or more cold aisles, such as exemplary cold aisle 151. The cooling device 170 can draw in outside air 172 and cool such outside air 172 to generate the cooled air 173 provided to, for example, the cold aisle 151. Alternatively, or in addition, the cooling device 170 can draw in heated air 171, such as from the hot aisle 141, and cool such heated air 171, to generate the cooled air 173 being provided to the cold aisle 151. If the cooling device 170 does not draw in the heated air 171 from the hot aisle 141, the heated air within the hot aisle 141, exemplarily shown in FIG. 1 by the wavy lines 125, can be exhausted to the outside of the building housing the devices.

To provide various advantages, described in detail below, gas piping, such as the exemplary gas piping 180 shown in the exemplary system 100 of FIG. 1, can be installed, positioned and routed, within the hot aisles of a building containing waste heat generating devices. For example, branches of the gas piping 180, namely the branches 181 and 182, delivering gas to the gas-fueled power sources 111 and 121, respectively, can be positioned in the hot aisle 141. Similarly, branch 183 of the gas piping 180, delivering gas to the gas-fueled power source 131, can be positioned in the hot aisle 142. Additionally, according to one aspect, the various cold aisles of a building, such as the exemplary cold aisles 151 and 152 that are shown in FIG. 1, can be within a defined space bounded by devices, walls, ceilings, and other like impediments to airflow. Conversely, according to such an aspect, the various hot aisles of the building can extend into a plenum space, such as the exemplary plenum space 160. As will be recognized by those skilled in the art, a plenum space can be a space between a drop ceiling and a ceiling, or between a raised floor and a floor, through which wiring, ductwork, piping and other like support structures can be routed. By connecting a plenum space with hot aisles, more of the gas piping, such as the exemplary gas piping 180, can be routed through hot aisles, since a plenum space connected with hot aisles can, itself, be considered to be part of the hot aisles.

By locating gas piping, such as exemplary gas piping 180, and the associated branches thereof, such as exemplary branches 181, 182 and 183, within hot aisles, various advantages can be realized. One such advantage can be the increase in the temperature of the gas routed through the gas piping 180. Some gas-fueled power sources, such as, for example, fuel cells, can require that incoming gas be at a temperature that is higher then the temperature at which gas is obtained from a gas source. Consequently, for such gas-fueled power sources, the gas being provided thereto can require some form of preheating. By locating gas piping within hot aisles, such preheating can be performed by the warmth of the hot aisle itself.

Another advantage to routing gas piping in hot aisles can be the heating provided to various valves, such as exemplary valves 187, 188 and 189, by the heated air of the hot aisles through which the gas piping is run, and in which such valves would be positioned. Such heating can reduce the risk of valve freeze and other like disadvantages associated with cold gas valves. More specifically, gas for gas-fueled power sources can be pumped through gas piping initially in liquid form and then gasified prior to being provided to the gas-fueled power sources. For example, propane can be provided in liquid form, and then gasified prior to being provided to a propane-burning power source. As another example, liquid natural gas can be provided in liquid form, and then gasified prior to being provided to a natural-gas-consuming power source, such as a fuel cell. By pumping gas in liquid form through gas piping, and then gasifying it prior to providing it to gas-fueled power sources, efficiencies can be realized in the energy consumed to deliver such gas. More specifically, liquefied gas can be delivered utilizing lower flow rates, which can decrease the amount of energy necessary to pump such liquefied gas. Gasification, however, is an endothermic process that can consume heat and, consequently, can result in valve or pipe freezing if a sufficient quantity of heat is not provided to prevent such freezing and otherwise aid the gasification process. Consequently, an advantage to positioning gas piping in hot aisles can be the provision of heat, from such hot aisles, to aid gasification and prevent freezing associated therewith.

To achieve the above-described advantages, additional mechanisms can be utilized to facilitate the transfer of heat from a hot aisle to the gas in gas piping that is routed through such a hot aisle. For example, gas piping in a hot aisle, such as exemplary gas piping 180, can be constructed and built to comprise additional loops, zigzags, or other like extensions of the length of gas piping in the hot aisle. By increasing the length of gas piping in the hot aisle, the amount of heat absorbed by such gas, from the hot aisle can be increased.

As another example, intermediate media can be utilized to facilitate the transfer of heat from the hot aisle to the gas in gas piping routed through such a hot aisle. For example, a valve, such as the exemplary valve 187, can be part of the above described gasification process. In such an example, such a valve can be a focused endothermic area. The heat from the hot aisle, such as the exemplary hot aisle 141, can be distributed throughout the hot aisle 141, and, consequently, it can be difficult to direct heat to a specific area, such as the valve 187. To facilitate the transfer of heat to such a valve, the valve, and, optionally, a corresponding portion of the gas piping 180, or the branch 181 can be immersed in a vessel of liquid, such as a container of water. The container of water can comprise a greater surface area than the valve 187 and, consequently, can absorb a greater amount of heat from the hot aisle 141. The water can then facilitate the transfer of such a greater amount of heat to the valve 187. Other liquids and containers can, likewise, be utilized to facilitate heat transfer from a hot aisle to gas piping routed therethrough. Additionally, according to one aspect, such a container and heat transfer medium can act as a thermal capacitor that can store heat during periods when the ambient temperature in the hot aisle is higher, and release such heat, such as into the gas piping, during periods when the ambient temperature in the hot aisle decreases. Another advantage of routing gas piping through a vessel with a heat transfer liquid can be the visual indication of a gas leak. More specifically, gas from such a gas leak would manifest itself as bubbles or air pockets within the liquid and would be visibly detectable, either by a human, or by automated detection mechanisms.

As yet another example of additional mechanisms that can be utilized to facilitate the transfer of heat from a hot aisle to the gas in gas piping that is routed through such a hot aisle, the material, size and shape of gas piping, such as exemplary gas piping 180, can be selected to facilitate heat transfer from a hot aisle to gas in gas piping routed therethrough. For example, gas piping, such as exemplary gas piping 180, can be constructed from metals that are efficient conductors of heat such as, for example, copper. As another example, the size and shape of the gas piping can be constructed to facilitate the transfer of heat. For example, gas piping can be constructed to include fins or other like elements increasing the surface area of the gas piping and, thereby, facilitating the transfer of heat from hot aisles through which such gas piping is routed to the gas in such gas piping.

Furthermore, because the gas piped through the gas piping 180 can have a substantially lower temperature than the air within the hot aisles, such as exemplary hot aisles 141 and 142, the routing of the gas piping 180 through such hot aisles can act to reduce the temperature of the air within such hot aisles, which can enable the cooling device 170 to cool down the heated air 171 into the cold air 173 more easily and more efficiently. As will be described in further detail below, additional advantages can be realized by positioning gas-fueled power sources, such as exemplary gas fueled power sources 111, 121 and 131 within the hot aisles, such as exemplary hot aisles 141 and 142, as well. To the extent that such gas-fueled power sources are positioned within hot aisles, the routing of the gas piping 180, and its associated branches, through hot aisles is made easier.

According to one aspect, gas piping, such as the exemplary gas piping 180, can comprise a coating or other like externally applied element, which can aid in the detection of gas leaks from such gas piping. More specifically, such a coating can exhibit visually detectable changes when contacted by the gas carried within the gas piping 180. For example, such a coating can change color when exposed to the gas carried within the gas piping 180. As another example, such a coating can generate heat, infrared light, or other like output that can be visually detected with appropriate instruments, such as infrared detector or heat detector. Gas leaks from the gas piping 180 can, thereby, be more easily identified and repaired.

The exemplary positioning of the gas piping 180, within the exemplary system 100 of FIG. 1, can be advantageous for gases that are lighter than air. More specifically, by positioning the gas piping 180 physically above the various devices and gas-fueled power sources, such as the exemplary devices 110, 120 and 130, and such as the exemplary gas-fueled power sources 111, 121 and 131, the gas piping 180 can be located in the airstream "after" potential ignition sources, such as those provided by the various devices and gas-fueled power sources. More specifically, because the gas carried by the gas piping 180 can be lighter than air, any gas potentially leaking from the gas piping 180 can rise from the gas piping and, thereby, move in a direction opposite of potential ignition sources, such as those provided by the various devices and gas-fueled power sources. The positioning of gas leak detection devices, such as exemplary gas leak detection devices 191 and 192, can take into account such gaseous properties. For example, the exemplary gas leak detection devices 191 and 192 can be positioned above the gas piping 180, such as is illustrated by the exemplary system 100 of FIG. 1, because gas that is lighter than air, should it leak from the gas piping 180, can pool near the ceiling. The positioning of such gas leak detection devices to the ceiling and above such gas piping 180 can enable those devices to more efficiently detect potential gas leaks from the gas piping 180.

Figure 2:
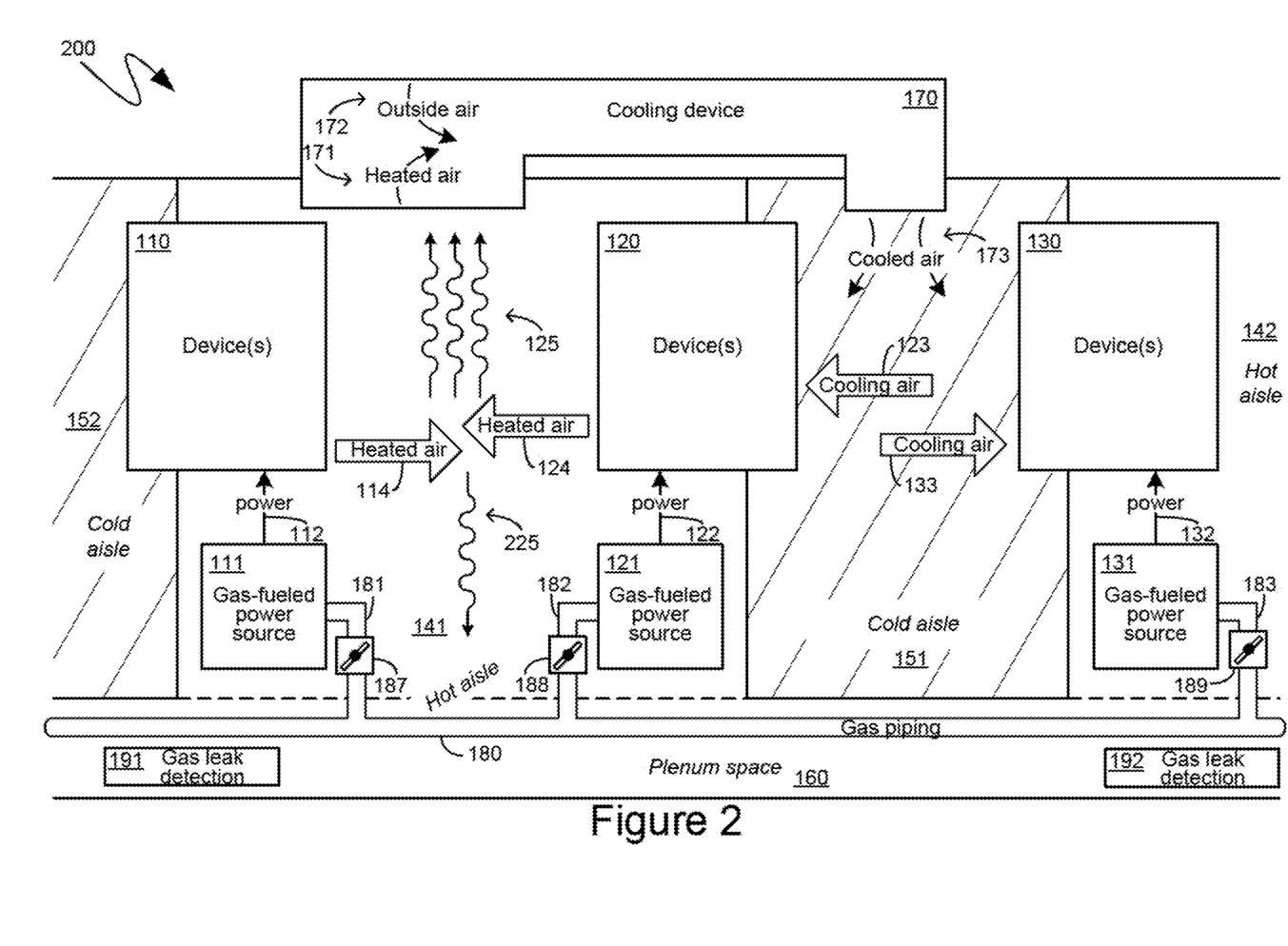
FIG. 2 is a block diagram of another exemplary gas distribution system within a temperature-differentiated environment.

According to an alternative aspect, however, the gas piping 180 can carry gases that are heavier than air. In such an instance, the gas piping 180 can be located below the devices and gas-fueled power sources. Turning to FIG. 2, the exemplary system 200 shown therein illustrates an exemplary orientation of the gas piping 180 in a plenum space 160 that is between a subfloor and floor of a building housing devices and additional hardware. The numerical identifiers utilized in FIG. 2 are the same as those in FIG. 1 for the same components, and exemplary system 200 of FIG. 2 primarily illustrates an alternative physical arrangement of those same components. More specifically, as graphically illustrated in FIG. 2, gas-fueled power sources can be located physically below the devices, and the gas piping can be located below both the devices and the gas fueled power sources in the plenum space 160 between the subfloor and the floor. As will be recognized by those skilled in the art, while the heated air of a hot aisle, such as the exemplary hot aisle 141, can typically rise, as illustrated by the wavy lines 125, at least some heat will also propagate throughout all of the open space, including the plenum space 160, as illustrated by the wavy lines 225. Consequently, even though the gas piping can be located in the plenum space 160 below the devices, such a plenum space 160 can still be considered part of the hot aisle, and the above-described advantages can still be realized by locating the gas piping 180 in a hot aisle below the devices.

By locating the gas piping 180 below the gas-fueled power sources and the devices, such as is illustrated by the exemplary system 200 of FIG. 2, any leak of the heavier than air gas carried by the gas piping 180 can still avoid potential ignition sources in the airstream. More specifically, devices, such as the exemplary devices 110, 120 and 130 can draw air from cold aisles across such devices to hot aisles, where such air will rise and either be vented outside or be cooled by climate control devices, such as exemplary cooling device 170. By contrast, any leak of the heavier than air gas carried by the gas piping 180 will likely pool near the floor and, since the gas piping 180 is already located physically below the devices, and gas fueled power sources, such heavier than air gas can avoid potential ignition sources in the airstream by being outside of the airstream. Gas leak detection, such as the exemplary gas leak detection 191 and 192, can, again, be located proximate to where leaking gas would likely pool. While in the exemplary system 100 of FIG. 1 such gas leak detection was illustrated as being located near the ceiling, for lighter than air gases, in the exemplary system 200 of FIG. 2 such gas leak detection can be located near the floor where the heavier than air gases carried by the exemplary gas piping 180 of the system 200 can pool. Consequently, as illustrated in FIG. 2, the exemplary gas leak detection 191 and 192 can be located below the gas piping 180, near the floor.

Figure 3:
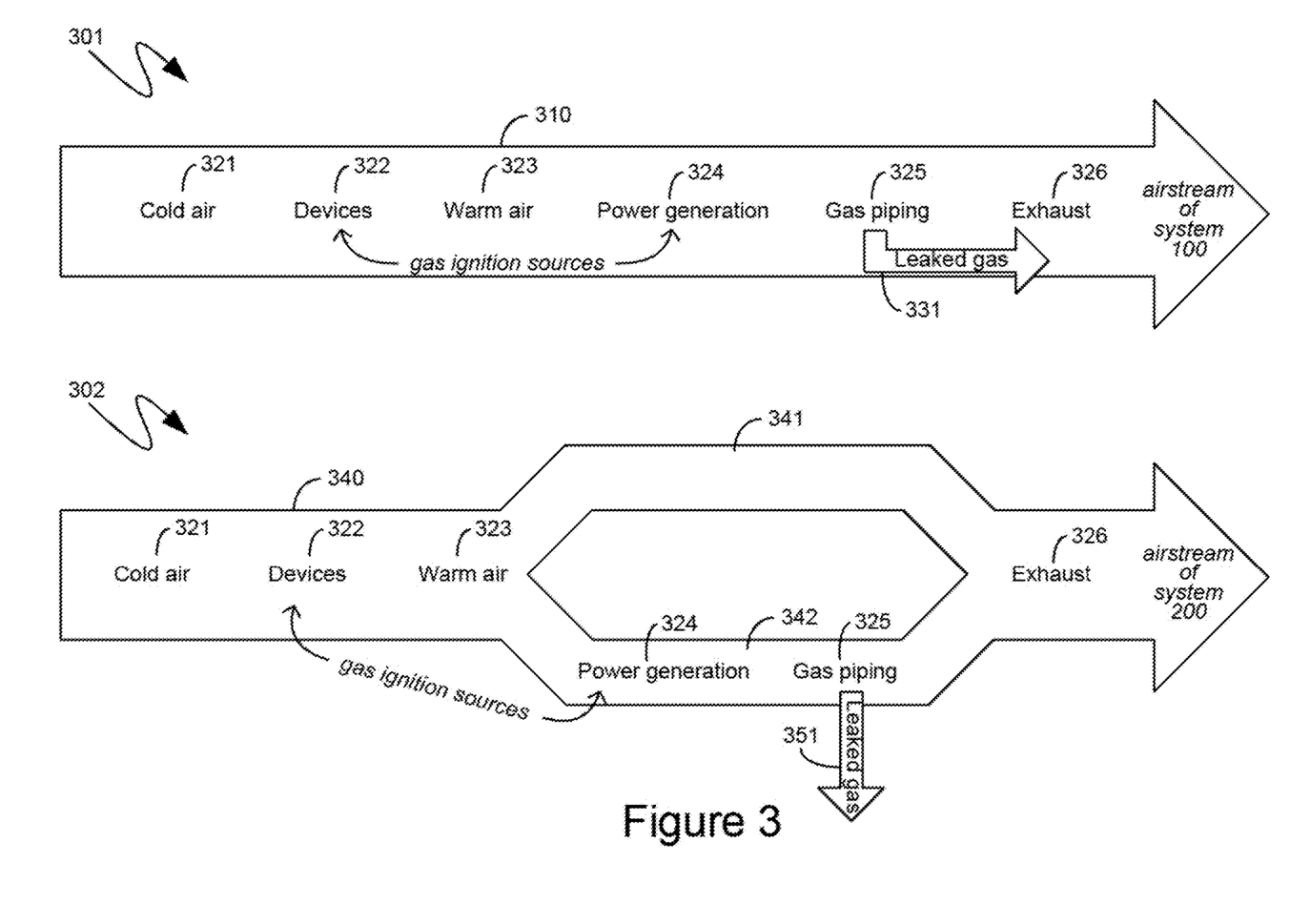
FIG. 3 is a block diagram of exemplary airstreams of the exemplary environments of FIGS. 1 and 2.

As indicated previously, according to one aspect, gas piping, such as exemplary gas piping 180, can be located so that the gas carried by the gas piping 180 can be kept away from ignition sources, taking into account the airstream of the climate controlled environment in which such gas piping is located. Turning to FIG. 3, the illustration 301 provides a graphical visualization of the airstream 310 of the system 100 that was shown in FIG. 1, as well as the location, within the airstream 310, of the various components of system 100 shown in FIG. 1. More specifically, and as illustrated in FIG. 3, the airstream 310 can commence with the introduction of the cold air 321, such as from the cooling device 170 shown in FIG. 1. The airstream 310 can then flow past devices 322, thereby turning into the warm air 323, as illustrated. Continuing, the airstream 310 can flow past the power generation 324, before finally flowing past the gas piping 325 and then becoming exhaust air 326. As illustrated in FIG. 3, gas ignition sources can include the devices 322 and the power generation 324. By contrast, any leaked gas 331, from the gas piping 325 will proceed away from such gas ignition sources in the air stream 310, as graphically illustrated in FIG. 3. Locating gas piping transporting lighter than air gas in the hot aisle, in an elevated location, can, therefore, keep such gas in a portion of the airstream that is not, and will not be, in communication with gas ignition sources.

The illustration 302, in FIG. 3, provides a graphical visualization of the airstream 340 of the system 200 that was shown in FIG. 2, as well as the location, within the airstream 340 of the various components of the system 200 shown in FIG. 2. For ease of reference, the same identifying numbering is used for the same components within the illustration 302 as within the illustration 301 that was described in detail above. More specifically, as illustrated in FIG. 3, the airstream 340 can commence with the introduction of the cold air 321, such as from the cooling device 170 shown in FIG. 2, and can then be drawn past the devices 322, thereby cooling such devices and becoming the warm air 323. As illustrated by the wavy lines 125 of the system 200 of FIG. 2, some of the warm air 323 can be directly exhausted as the exhaust air 326. Such a scenario is graphically represented by the branch 341 of the airstream 340, shown in FIG. 3. According to one aspect, such as that illustrated in the system 200 of FIG. 2, power generation components, such as the exemplary gas fueled power sources of the system 200 of FIG. 2, by being located below the devices, can be outside of the above-described airstream branch 341. Instead, such power generation components, and the gas piping that feeds them, can remain part of the hot aisle and can be part of the airstream that circulates below the devices before rising and becoming part of the exhaust 326. Turning back to FIG. 2, such a secondary airstream is partially illustrated by the wavy lines 225. Turning back to FIG. 3, such a secondary airstream is graphically represented by the branch 342 of the airstream 340. As illustrated by the illustration 302 of FIG. 3, the power generation 324 can be outside of the airstream branch 341, and can, instead, be in the airstream branch 342. In a similar manner, since the gas piping 180, shown in the system 200 of FIG. 2, is positioned below the power generation components and below the devices, the gas piping 325 of the illustration 302 of FIG. 3 is also illustrated as being outside of the airstream branch 341 and, instead, is illustrated as part of the airstream branch 342. Because the gas carried by the gas piping 325 can be heavier than air, in the system 200, whose airstream is represented by the airstream 340 of FIG. 3, any such leaked gas 351 can leak in the manner illustrated by the leaked gas 351 arrow shown in the illustration 302 of FIG. 3, namely away from the airstream 340 and, more specifically, away from the airstream branch 342. Since such leaked gas 351 can be below the power generation 362 and, being heaver than air, since such leaked gas can flow orthogonally to the airstream branch 342, the gas carried by the gas piping 361 can remain away from potential gas ignition sources, such as the power generation 362 and the devices 352, as graphically represented by the airstream 340, and airstream branches 341 and 342 thereof, illustrated in FIG. 3.

Insofar as the above-described safety aspects are concerned, it can be sufficient to locate only gas leakage points in the hot aisles, such that such gas leakage points are in a portion of the airstream where any potentially leaked gas is either orthogonal to such an airstream, or is moved by such an airstream away from potential gas ignition sources. As utilized herein, the term "gas leakage points" means any portion of gas piping where there is a joint or connection between two physically distinct gas-carrying members that are joined or connected, or any other portion of gas piping comprising a gasket or other type of seal.

Figure 4:
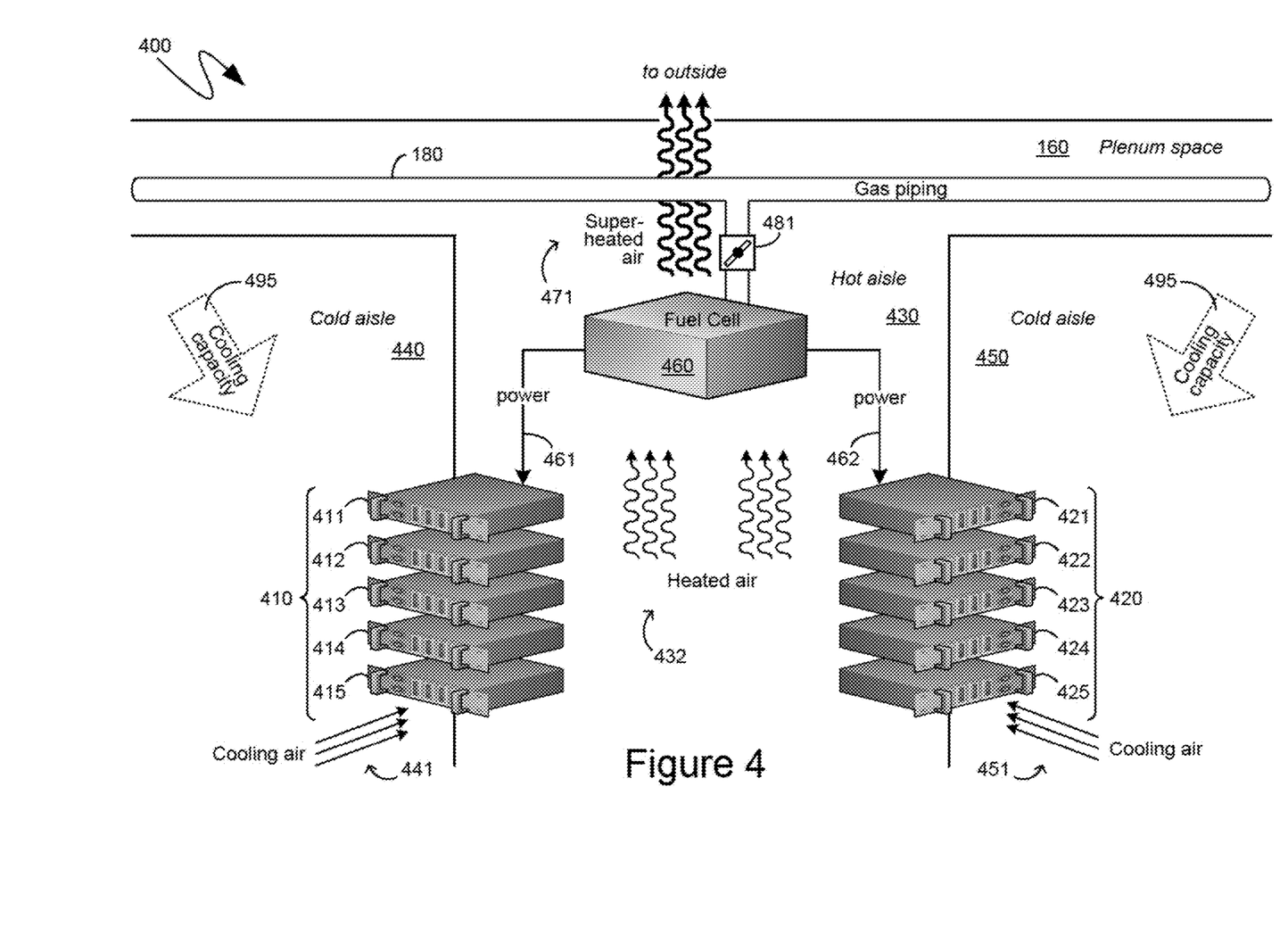
FIG. 4 is a block diagram of an exemplary gas distribution system within a data center.

Turning to FIG. 4, advantages associated with the positioning of power generation components in the hot aisle, together with the gas piping, are further illustrated by the exemplary system 400 shown therein. While the exemplary system 400, shown in FIG. 4, specifically illustrates a data center environment in which server computing devices are powered by a fuel cell, the descriptions provided herein, and the advantages realized thereby, are equally applicable to other environments, and are illustrated and described within the context of a data center environment as a specific example, and not by way of limitation. The exemplary system 400 of FIG. 4 comprises multiple collections of computing devices, such as the exemplary server computing devices 411, 412, 413, 414 and 415, as well as the exemplary server computing devices 421, 422, 423, 424 and 425, which can be arranged in vertical groupings, such as in racks. The collection of server computing devices 410, comprising the individual exemplary server computing devices 411, 412, 413, 414 and 415 is illustrated, in the exemplary system 400 of FIG. 4, as being separate and apart from the collection of server computing devices 420, comprising the individual exemplary server computing devices 421, 422, 423, 424 and 425. Thus, according to one aspect, the collection of server computing devices 410 can comprise one rack of server computing devices, while the collection of server computing devices 420 can comprise a separate, different rack of server computing devices. In accordance with another aspect, however, the collections of server computing devices 410 and 420 can be arranged in the same rack, or across three or more different racks. Insofar as the descriptions below are concerned, it is sufficient that the collections of server computing devices 410 and 420 exhaust heated air, such as the exemplary heated air 432, into a hot aisle 430 into which is located a power source for one or more of the individual server computing devices of the collections of server computing devices 410 and 420, such as the exemplary fuel cell 460 illustrated in FIG. 4.

The various server computing devices of, for example, the collection of server computing devices 410, can draw in the cooling air 441 from a cold aisle 440, utilize such cooling air 441 to cool the various components of the server computing devices, and exhaust the resulting heated air 432 into the hot aisle 430. The collection of server computing devices 410, therefore, can be positioned between the cold aisle 440 and the hot aisle 430, such that they can draw in the cooling air 441, from the cold aisle 440, and exhaust the heated air 432, into the hot aisle 430. In an analogous manner, the collection of server computing devices 420 can be positioned between the cold aisle 450 and the hot aisle 430, such that they can draw in cooling air 451, from the cold aisle 450, utilize such cooling air 451 to cool the processing components, and other components, of the individual server computing devices of the collection of server computing devices 420, and then exhaust the resulting heated air 432 into the hot aisle 430.

In the illustrated exemplary system 400 of FIG. 4, the collection of server computing devices 410 can receive power 461 from a fuel cell 460. In a like manner, the collection of server computing devices 420 can receive power 462, such as from the same fuel cell 460. The fuel cell 460 is illustrated as being positioned above the collections of server computing devices 410 and 420 within the hot aisle 430. With such a position, the fuel cell 460 can utilize the heated air 432, of the hot aisle 430, to aid in electrical power generation, by the fuel cell 460, and can exhaust much warmer air, nominated "super-heated air" 471, which can, according to one aspect, be vented to the outside of the data center. By way of a specific example, to illustrate the magnitude of the temperature differentials contemplated, the cooling air utilized by server computing devices, such as the exemplary cooling air 441 and 451, can be of a temperature of approximately thirty degrees Celsius. The heated air exhausted by such server computing devices, such as the exemplary heated air 432, can be of a temperature of approximately sixty-to-seventy degrees Celsius. By contrast, fuel cell operating temperatures, such as the operating temperatures of the exemplary fuel cell 460, can be in the range of one hundred and fifty to seven hundred degrees Celsius. Consequently, while the heated air 432 can no longer be useful for the cooling of, for example, server computing devices, it can still be substantially cooler than the operating temperatures of a fuel cell, such as exemplary fuel cell 460, and, thereby, can be advantageously utilized by the fuel cell. For example, fuel cells often preheat the air going into the fuel cell, in order to maintain internal temperatures at which the operation of the fuel cell is more efficient, and for other thermodynamic reasons. The exemplary system 400 of FIG. 4 can, via the mechanisms described in detail above, utilize the heated air 432, thereby avoiding the need to preheat the air going into the fuel cell, or at least reduce the amount of energy required to preheat such heated air 432 further. The superheated air 471 that is exhausted by the fuel cell 460 can more efficiently heat the gas piping 180 and the gas valve 481, thereby realizing the above-detailed advantages. For example, as indicated previously, gasification can be an endothermic process that can consume increased amounts of heat, and, optimally, such heat would be directed to a relatively discrete area such as, for example, a valve. In such an instance, the valve at which the gasification is occurring can be positioned so as to be heated by the superheated air 471 such as is illustrated in the system 400 of FIG. 4 by the exemplary valve 481. The valve 481 can then receive the greater amount of heat that is desirable, as compared with other areas of the gas piping 180, which can still be in the hot aisle 430, and can still derive the above-described advantages.

Because the fuel cell 460 is positioned to consume the heated air 432 of the hot aisle 430, the cooling capacity 495 of the data center, providing cooling to cold aisles, such as the exemplary cold aisles 440 and 450, need not be sized to take into account the fuel cell 460. More specifically, the cooling capacity 495 need only sufficiently cool the air of the cold aisles to provide for the required cooling of the server computing devices. Fuel cells, such as the exemplary fuel cell 460, by being positioned in the hot aisle, such as exemplary hot aisle 430, can be positioned to not consume the air of the cold aisles and, consequently, the cooling capacity 495 need not provide cooling air to the cold aisles on account of the fuel cells.

The descriptions above include, as a first example, a building comprising: one or more devices producing waste heat; at least one cold aisle from which the one or more devices draw cooling air to cool the one or more devices; at least one of: a quantity of gas piping in the hot aisle sufficient to increase a temperature of gas carried by the gas piping, or leakage points of the gas piping in the hot aisle and after gas ignition sources in an airstream from the cold aisle to the hot aisle through the one or more devices.

A second example is the building of the first example, wherein the gas piping comprises a coating that interacts with gas to generate an indication of a gas leak from the gas piping.

A third example is the building of the first example, further comprising at least one gas-fueled power source in the at least one hot aisle providing power to at least some of the one or more devices.

A fourth example is the building of the first example, wherein the gas piping comprises fins that increase a surface area of the gas piping in the hot aisle.

A fifth example is the building of the first example, further comprising one or more gas leak detectors mounted vertically higher than the gas piping and nearer to a ceiling of the building than the gas piping, the gas piping being located vertically higher than the one or more devices, wherein both the one or more gas leak detectors and the gas piping are located below the ceiling, and wherein further the gas piping carries lighter-than-air gas.

A sixth example is the building of the first example, wherein the gas piping comprises loops in order to fit the quantity of gas piping sufficient to increase the temperature of the gas into the hot aisle.

A seventh example is the building of the first example, further comprising one or more gas leak detectors mounted vertically lower than the gas piping and nearer to a floor of the building than the gas piping, the gas piping being located vertically lower than the one or more devices, wherein both the one or more gas leak detectors and the gas piping are located above the floor, and wherein further the gas piping carries heavier-than-air gas.

An eighth example is the building of the first example, further comprising a cooling device providing cooled air to the at least one cold aisle and drawing in air from the at least one hot aisle, the quantity of gas piping in the hot aisle being sufficient to also decrease a temperature of the air from the hot aisle being drawn in by the cooling device.

A ninth example is the building of the first example, wherein the building is a data center and the one or more devices producing the waste heat are computing devices.

A tenth example is the building of the first example, further comprising: a cooling device providing cooled air to the at least one cold aisle; and at least one fuel cell in the at least one hot aisle, the at least one fuel cell consuming air from the hot aisle so that an ability of the cooling device to maintain the cold aisle is unaffected by the at least one fuel cell.

An eleventh example is the building of the tenth example, wherein a portion of the gas piping, in which gasification of a liquid into the gas occurs, is positioned in an exhaust of the at least one fuel cell.

An twelfth example is the building of the first example, wherein at least a portion of the gas piping in the hot aisle is in a container of liquid that facilitates transfer of heat from the hot aisle to the gas carried by the gas piping.

A thirteenth example is a method of routing gas piping in a building, the method comprising the steps of: identifying one or more hot aisles into which waste heat from one or more devices is exhausted, the one or more devices drawing in cooling air from one or more cold aisles; and performing at least one of: routing a quantity of the gas piping in at least some of the one or more hot aisles sufficient to increase a temperature of gas carried by the gas piping; or positioning leakage points of the gas piping in the at least some of the one or more hot aisles and after gas ignition sources in an airstream from the one or more cold aisles to the one or more hot aisles through the one or more devices.

A fourteenth example is the method of the thirteenth example, wherein the gas piping comprises a coating that interacts with gas to generate an indication of a gas leak from the gas piping.

A fifteenth example is the method of the thirteenth example, wherein the gas piping comprises loops in order to fit the quantity of gas piping sufficient to increase the temperature of the gas into the hot aisle.

A sixteenth example is the method of the thirteenth example, further comprising the steps of: routing the gas piping in the at least some hot aisles so as to also decrease a temperature of air from the at least some hot aisles being drawn in by one or more cooling devices, the one or more cooling devices cooling the air drawn in from the at least some hot aisles and providing the cooled air to at least some of the cold aisles.

A seventeenth example is a gas distribution system for a building, the gas distribution system comprising at least one of: a quantity of gas piping in one or more hot aisles inside the building, into which one or more devices installed in the building exhaust waste heat, sufficient to increase a temperature of gas carried by the gas piping, or leakage points of the gas piping in the one or more hot aisles and after gas ignition sources in an airstream comprising the exhausting of the waste heat from the one or more devices.

An eighteenth example is the gas distribution system of the seventeenth example, wherein the gas piping comprises a coating that interacts with gas to generate an indication of a gas leak from the gas piping.

A nineteenth example is the gas distribution system of the seventeenth example, wherein the quantity of gas piping is located in the one or more hot aisles and is sufficient to also decrease a temperature of air from the one or more hot aisles that is being drawn in by one or more cooling devices, the one or more cooling devices cooling the air drawn in from the one or more hot aisles and providing the cooled air to one or more cold aisles inside the building.

And a twentieth example is the gas distribution system of the seventeenth example, wherein the building is a data center and the one or more devices producing the waste heat are computing devices.

As can be seen from the above descriptions, the positioning of gas piping in hot aisles has been presented. Which, in view of the many possible variations of the subject matter described herein, we claim as our invention all such embodiments as may come within the scope of the following claims and equivalents thereto.

We claim:

1. A building comprising:
   a cold aisle from which one or more devices draw cooling air, thereby cooling the one or more devices;
   a hot aisle into which the one or more devices exhaust waste heat produced by the one or more devices;
   one or more cooling devices providing cooled air to the cold aisle and drawing in air from the hot aisle;
   an airstream flowing from the cold aisle to the hot aisle, the airstream being created by both: (1) the one or more devices drawing the cooling air from the cold aisle and exhausting the waste heat into the hot aisle and (2) the one or more cooling devices providing the cooled air to the cold aisle and drawing in the air from the hot aisle;
   delivery gas piping positioned in the hot aisle and providing gas to one or more gas-fueled power sources; and
   interconnecting gas piping, interconnecting multiple of the delivery gas piping, the interconnecting gas piping positioned in a plenum space open to the hot aisle and located below the one or more devices and the one or more gas-fueled power sources;
   wherein the airstream comprises a branch that extends into the plenum space below the one or more devices and the one or more gas-fueled power sources.

2. The building of claim 1, wherein at least one of the delivery gas piping or the interconnecting gas piping comprises a coating that interacts with gas to generate an indication of a gas leak from the at least one of the delivery gas piping or the interconnecting gas piping.

3. The building of claim 1, further comprising at least one gas-fueled power source in the hot aisle providing power to at least some of the one or more devices, the at least one gas-fueled power source being located vertically below the one or more devices so that leaked gas descends from the at least one gas-fueled power source and away from the one or more devices.

4. The building of claim 1, wherein the delivery gas piping comprises fins that increase a surface area of the delivery gas piping in the hot aisle.

5. The building of claim 1, wherein the delivery gas piping comprises loops in order to fit a quantity of delivery gas piping sufficient to increase the temperature of the gas into the hot aisle.

6. The building of claim 1, further comprising one or more gas leak detectors mounted vertically lower than the interconnecting gas piping and nearer to a floor of the building than the interconnecting gas piping, the interconnecting gas piping being located vertically lower than the one or more devices, wherein both the one or more gas leak detectors and the interconnecting gas piping are located above the floor, and wherein further the interconnecting gas piping carries heavier-than-air gas.

7. The building of claim 1, further comprising a cooling device providing cooled air to the cold aisle and drawing in air from the hot aisle, the quantity of delivery gas piping in the hot aisle being sufficient to also decrease a temperature of the air from the hot aisle being drawn in by the cooling device.

8. The building of claim 1, wherein the building is a data center and the one or more devices producing the waste heat are computing devices.

9. The building of claim 1, further comprising:
   at least one fuel cell in the hot aisle, the at least one fuel cell consuming air from the hot aisle so that an ability of the cooling device to maintain the cold aisle is unaffected by the at least one fuel cell.

10. The building of claim 9, wherein a portion of the delivery gas piping, in which gasification of a liquid into the gas occurs, is positioned in an exhaust of the at least one fuel cell.

11. The building of claim 1, wherein at least a portion of the delivery gas piping in the hot aisle is in a container of liquid that facilitates transfer of heat from the hot aisle to the gas carried by the delivery gas piping.

12. A method of routing gas piping in a building, the method comprising the steps of:
   identifying a hot aisle into which waste heat from one or more devices is exhausted, the one or more devices drawing in cooling air from a cold aisle into which one or more cooling devices provide cooled air, the one or more cooling devices drawing in air from the hot aisle;
   identifying an airstream flowing from the cold aisle to the hot aisle, the airstream being created by both: (1) the one or more devices drawing the cooling air from the cold aisle and exhausting the waste heat into the hot aisle and (2) the one or more cooling devices providing the cooled air to the cold aisle and drawing in the air from the hot aisle;

routing delivery gas piping in the hot aisles;
positioning interconnecting gas piping, interconnecting multiple of the delivery gas piping, the interconnecting gas piping positioned in a plenum space, open to the hot aisle and located below the one or more devices and the one or more gas-fueled power sources;
wherein the airstream comprises a branch that extends into the plenum space below the one or more devices and the one or more gas-fueled power sources.

13. The method of claim 12, wherein at least one of the delivery gas piping or the interconnecting gas piping comprises a coating that interacts with gas to generate an indication of a gas leak from the at least one of the delivery gas piping or the interconnecting gas piping.

14. The method of claim 12, wherein the delivery gas piping comprises loops in order to fit a quantity of delivery gas piping sufficient to increase the temperature of the gas into the hot aisles.

15. The method of claim 12, further comprising the steps of: routing the delivery gas piping in the hot aisle so as to also decrease a temperature of air from the hot aisle being drawn in by the one or more cooling devices.

16. The method of claim 12, wherein at least one gas-fueled power source in the hot aisle provides power to at least some of the one or more devices, the at least one gas-fueled power source being located vertically below the one or more devices so that leaked gas descends from the at least one gas-fueled power source and away from the one or more devices.

17. A gas distribution system for a building, the gas distribution system comprising at least one of:
delivery gas piping in a hot aisle inside the building, into which one or more devices installed in the building exhaust waste heat, the one or more devices drawing in cooling air from a cold aisle into which one or more cooling devices provide cooled air, the one or more cooling devices drawing in air from the hot aisle; and
interconnecting gas piping, interconnecting multiple delivery gas piping, the interconnecting gas piping positioned in a plenum space, open to the hot aisle, and located below the one or more devices and the one or more gas-fueled power sources;
wherein the building comprises an airstream flowing from the cold aisle to the hot aisle, the airstream being created by both: (1) the one or more devices drawing the cooling air from the cold aisle and exhausting the waste heat into the hot aisle and (2) the one or more cooling devices providing the cooled air to the cold aisle and drawing in the air from the hot aisle; and
wherein further the airstream comprises a branch that extends into the plenum space below the one or more devices and the one or more gas-fueled power sources.

18. The gas distribution system of claim 17, wherein at least one of the delivery gas piping or the interconnecting gas piping comprises a coating that interacts with gas to generate an indication of a gas leak from the at least one of the delivery gas piping or the interconnecting gas piping.

19. The gas distribution system of claim 17, wherein the building is a data center and the one or more devices producing the waste heat are computing devices.

20. The gas distribution system of claim 17, wherein at least one gas-fueled power source in the hot aisle provides power to at least some of the one or more devices, the at least one gas-fueled power source being located vertically below the one or more devices so that leaked gas descends from the at least one gas-fueled power source and away from the one or more devices.

* * * * *